US007065491B2

(12) United States Patent
Tsai et al.

(10) Patent No.: US 7,065,491 B2
(45) Date of Patent: Jun. 20, 2006

(54) INVERSE-MODIFIED DISCRETE COSINE TRANSFORM AND OVERLAP-ADD METHOD AND HARDWARE STRUCTURE FOR MPEG LAYER3 AUDIO SIGNAL DECODING

(75) Inventors: Tsung-Han Tsai, Changhua Hsien (TW); Ya-Chau Yang, Tainan Hsien (TW)

(73) Assignee: National Central University, Taoyuan Hsien (TW)

( * ) Notice: Subject to any disclaimer, the term of this patent is extended or adjusted under 35 U.S.C. 154(b) by 762 days.

(21) Appl. No.: 10/078,021

(22) Filed: Feb. 15, 2002

(65) Prior Publication Data

US 2003/0158740 A1 Aug. 21, 2003

(51) Int. Cl.

*G10L 19/00* (2006.01)
*H04N 7/12* (2006.01)
*G06F 5/00* (2006.01)
*H03M 7/00* (2006.01)

(52) U.S. Cl. ..................... 704/500; 375/240.2; 710/53; 341/50

(58) Field of Classification Search ................ 704/500, 704/200.1

See application file for complete search history.

(56) References Cited

U.S. PATENT DOCUMENTS 5,224,213 A * 6/1993 Dieffenderfer et al. ....... 710/53
5,566,154 A * 10/1996 Suzuki .................... 369/59.26
5,608,713 A * 3/1997 Akagiri et al. ......... 369/124.08
5,654,952 A * 8/1997 Suzuki et al. ............ 369/59.16
5,867,819 A * 2/1999 Fukuchi et al. ............. 704/500
5,899,970 A * 5/1999 Sonohara ..................... 704/229
6,166,663 A * 12/2000 Chen et al. .................... 341/50
6,199,039 B1 * 3/2001 Chen et al. .................. 704/229
2002/0106020 A1 * 8/2002 Cheng et al. ............ 375/240.2

OTHER PUBLICATIONS

T. Skakamoto, M. Turuki, and T. Hase. "A fast MPEG-audio layer III Algorithm for a 32-bit MCU," IEEE transactions on Consumer Electronics, vol. 45, No. 3, Aug., 1999.*

ISO/IED 11172-3, Information technology-Coding of moving pictures and associated audio for digital storage medi at up to 1.5 Mbits/s. Part3-Audio.*

(Continued)

*Primary Examiner*—Vijay Chawan
*Assistant Examiner*—Myriam Pierre
(74) *Attorney, Agent, or Firm*—J.C. Patents

(57) ABSTRACT

An inverse-modified discrete cosine transform and overlap-add method, and hardware structure for MPEG Layer3 audio signal decoding. In order to have the MPEG Layer3 audio signal decoder have more competitive power in the consumer market, the present invention provides a low cost fast algorithm of the inverse-modified discrete cosine transform and overlap-add, so that the quantity of the operation needed in the decoding process can be significantly reduced to enhance the system performance. Afterwards, according to the fast algorithm, the present invention provides a hardware structure that is suitable for the inverse-modified discrete cosine transform and overlap-add in the MPEG Layer3 decoder. Since the hardware structure of the present invention makes the MPEG Layer3 decoder able to be implemented by the application specific integrated circuit (ASIC), the entire system can fulfill the low cost and high performance requirements.

16 Claims, 4 Drawing Sheets

OTHER PUBLICATIONS

T.H. Tsai, L.G. Chen, and T.C. Liu. “A novel MPEG-2 Audio Decoder with Efficient Data□□Arrangement and Memory Configuration”, IEEE Transactions on Consumer Electronics, vol. 43, No. 3, pp. 598-600, Aug. 1997.*

T.H. Tsai, L.G. Chen, and Ruei-Xi Chen. “Implementation strategy of MPEG-2 Audio Decoder and Efficient Multichannel Architecture”, Signal Processing Systems, 1997. SIPS 1997—Design and□□Implementation, 1997 IEEE workshop on, Nov. 3-5, 1997. pp. 293-299.*

Tsung-Han Tsai, Thou-Ho Chen, and Liang-Gee Chen. “Design and VLSI Implementation of MPEG□□audio decoder”. VLSI Technology, Systems and Applications, 1995. Proceedings of Technical □□Papers, 1995 International Symposium, May 31-Jun. 2, 1995. pp. 206-210.*

Tsung-Han Tsai, Thou-Ho Chen, and Liang-Gee Chen. “An MPEG Audio Decoder Chip.”□□IEEE Transactions on Consumer Electronics, vol. 41, Issue 1: pp. 89-96.*

* cited by examiner

INVERSE-MODIFIED DISCRETE COSINE TRANSFORM AND OVERLAP-ADD METHOD AND HARDWARE STRUCTURE FOR MPEG LAYER3 AUDIO SIGNAL DECODING

BACKGROUND OF THE INVENTION

1. Field of Invention

The present invention generally relates to a method and hardware structure for audio signal decoding, and more particularly, to an inverse-modified discrete cosine transform and overlap-add method and hardware structure for MPEG Layer3 audio signal decoding.

2. Description of Related Art

Digital audio signal processing is widely used. This is because the digital audio signal immunity to noise is higher than the analog signal. However, since it is quite often demanded to process a large amount of data within a very short time and still needs to maintain the effect of high audio quality, a lot of the audio signal compression standards have been developed. The motion picture experts group (abbreviated as MPEG) standard is widely accepted due to its high compression rate and low distortion. MPEG, using the different sensitivity of the human ear to different frequency bands, assigns fewer bits to the audio to which the human ear is not so sensitive, to achieve the objective of compression.

Furthermore, in order to accommodate different levels of audio quality with the compression method, MPEG is further divided into Layer1, Layer2 and Layer3. Generally speaking, the higher the level of the layer, the more complicated the compression method, the distortion of the corresponding recovered audio signal is much less, and the effect is better.

The encoding process of MPEG can be divided into the encoder and the decoder portions. In the encoder portion, the audio data is processed and converted into 32 data sub-bands by using the analysis sub-band filter bank. Then, the data belonging to different bands can be assigned to different bits according to the psycho-acoustical model that simulates the artificial ear acoustic effect. Afterwards, the objective of the compression can be achieved via quantization. Finally, the data is sent out in a specific data format framing.

The decoder portion looks like the reverse operation of the encoder. The data is unpacked first, and after the inverse quantization process, the 32 data sub-bands are integrated into the original audio data by using the synthesis sub-band filter bank.

As to the MPEG-II audio encoding standard, multichannel audio encoding is further provided, while all the other aspects are basically the same as the MPEG I. Multichannel audio can be divided into the Left (L) and Right (R) channel audio transmitted via the basic transmission channels T0, T1, and the Central (C), Left Surround (LS) and Right Surround (RS) channel audio transmitted via the extended transmission channels T2, T3, T4. The multichannel decoder is needed for the MPEG-II audio decoding to reconstruct the multichannel audio signal.

The MPEG LAYER3 compression standard, using the MPEG Layer3 (MP3) compression algorithm, is widely used in the application of digital broadcast and multimedia. As to the digital audio signal compression, MP3 is the most complicated algorithm, providing the highest compression rate within MPEG. MP3 utilizes the inverse-modified discrete cosine transform (hereinafter abbreviated as IMDCT) and the sub-band coding techniques, whereby MP3 can achieve such high compression rate.

The hardware structure of MPEG Layer1and Layer2 decoders has already been physically implemented by many researchers. However, there is no appropriate hardware structure to implement MP3. Most of the hardware structure design nowadays is implemented using the general digital signal processor (abbreviated as DSP). This design 5 utilizes program control to achieve the objective. However, a large amount of memory is needed for this design to store the program code, and thus the hardware burden and area is increased, so that the performance of the entire system cannot achieve the optimum.

SUMMARY OF THE INVENTION

The present invention provides an inverse-modified discrete cosine transform and overlap-add method and hardware structure for MPEG Layer3 audio signal decoding. The present invention implements the entire hardware structure via the high speed algorithm of the inverse-modified discrete cosine transform and overlap-add, so that the entire system is able to fulfill the low cost and high performance requirements.

In order to at least achieve the objective mentioned above and other objectives, the present invention provides an inverse-modified discrete cosine transform and overlap-add method for MPEG Layer3 audio signal decoding. At first, the 32 sub-band samples of the compressed audio signal are applied with the operation of the inverse-modified discrete cosine transform and overlap-add according to equation (1), inverse-modified discrete cosine transform:

$$x(i) = \sum_{k=0}^{\frac{n}{2}-1} X(k) * \cos(i, k) \quad 0 \le i \le \frac{n}{4} - 1 \text{ and } \frac{n}{2} \le i \le \frac{3n}{4} - 1$$

overlap-add:

$$Z(i)=x(i)*\mathrm{win}(i,p)$$

$$Z\left(\frac{n}{2} - 1 - i\right) = -x(i) * \mathrm{win}\left(\frac{n}{2} - 1 - i, p\right) \quad 0 \le i \le \frac{n}{4} - 1$$

$$Z(i)=x(i)*\mathrm{win}(i,p)$$

$$Z(n - 1 - i) = x(i) * \mathrm{win}(n - 1 - i, p) \quad \frac{n}{2} \le i \le \frac{3n}{4} - 1,$$

where X(k) is the sub-band sample and Z(i) is the sub-band sample after process. When window type is 0, 1, 3, n equals 36; whereas when window type is 2, n equals 12. Then, the dynamic window inverse-modified discrete cosine transform module is provided. The operation of the inverse-modified discrete cosine transform is processed by the multiplier-adder of the dynamic window inverse-modified discrete cosine transform module. The result after the operation of the inverse-modified discrete cosine transform is stored in the register stack of the dynamic window inverse-modified discrete cosine transform module. Afterwards, the operation of the overlap-add is processed by the multiplier-adder, and the result after the operation of the overlap-add is stored in the buffer memory of the dynamic window inverse-modified discrete cosine transform module.

The present invention further provides an inverse-modified discrete cosine transform and overlap-add hardware structure for MPEG Layer3 audio signal decoding. The hardware structure comprises the dynamic window inverse-modified discrete cosine transform module and the dynamic window inverse-modified discrete cosine transform buffer memory. The dynamic window inverse-modified discrete cosine transform module comprises the multiplier-adder and the register stack. The multiplier-adder is used to calculate the inverse-modified discrete cosine transform and overlap-add, the register stack is coupled to the multiplier-adder and is used to store the operation result of the inverse-modified discrete cosine transform. The dynamic window inverse-modified discrete cosine transform buffer memory is coupled to the dynamic window inverse-modified discrete cosine transform module and is used to store the operation result of the overlap-add.

In summary, the present invention implements the entire hardware structure by using the fast algorithm of the dynamic window inverse-modified discrete cosine transform and overlap-add, and makes the entire system fulfill the lost cost and high performance requirements.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows the decoding flow chart of the MP3 of the inverse-modified discrete cosine transform and overlap-add method and hardware structure for MPEG Layer3 audio signal decoding according to the present invention.

DESCRIPTION OF THE PREFERRED EMBODIMENTS

The present invention is suitable for the MPEG Layer3, but no matter whether MPEG-I or MPEG-II, the audio signal can all be decoded. As to digital audio signal compression, MP3 is the most complicated algorithm, and also provides highest compression rate. Therefore, the preferred embodiment provided by the present invention is aimed at the entire MP3 compression algorithm, so as to reduce the quantity of the data and operation. Thus, the fast algorithm is provided accordingly. Then, the entire hardware structure is implemented by using the fast algorithm, so that the entire system fulfills the low cost and high performance requirements.

Figure 1:
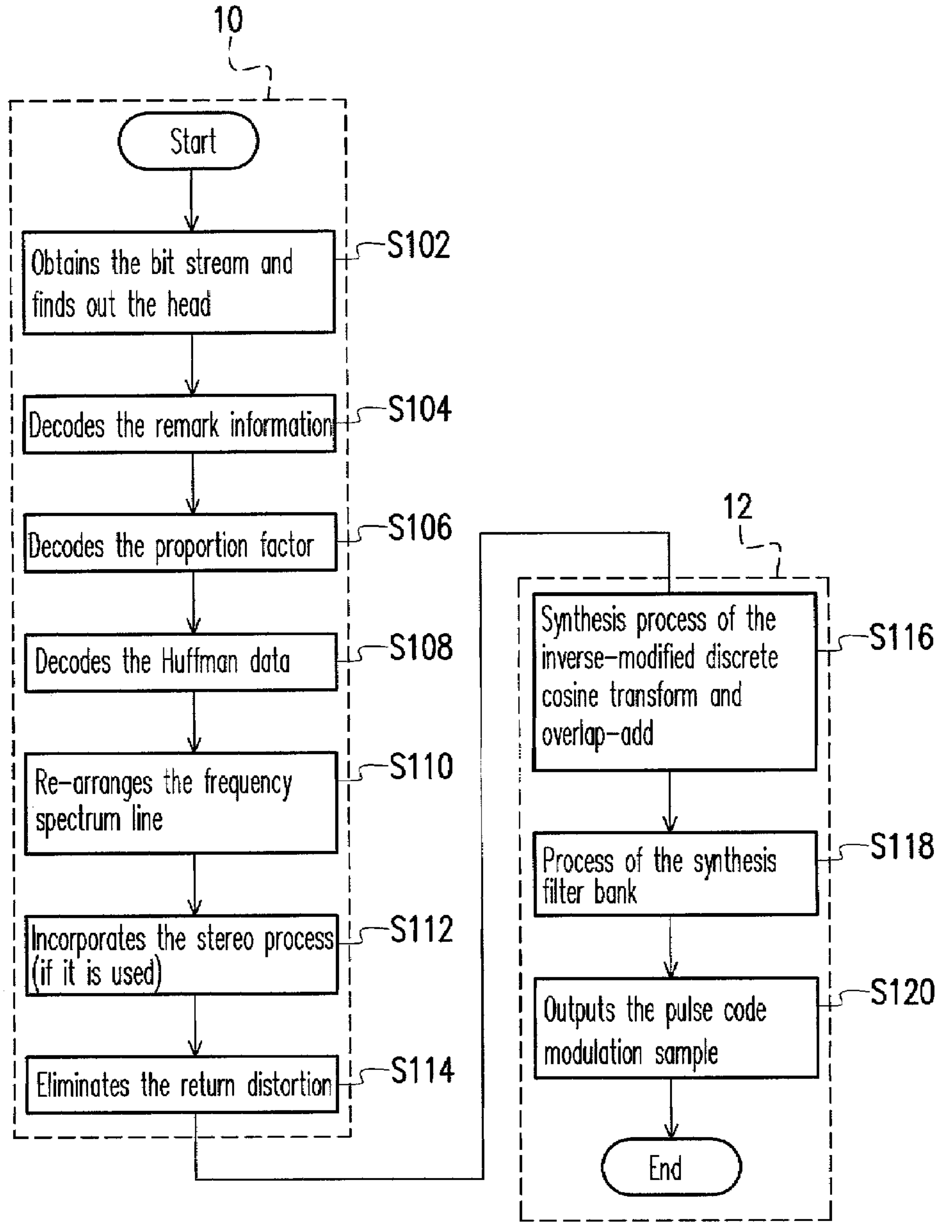

FIG. 1 schematically shows the decoding flow chart of the MP3 of the inverse-modified discrete cosine transform and overlap-add method and hardware structure for MPEG Layer3 audio signal decoding according to the present invention. The whole flow can be divided into the pre-process portion 10 and the post-process portion 12. The pre-process portion 10, first obtains the bit stream and finds out the head 10 (step s1 02). It then decodes the remark information (step s104), decodes the proportion factor (step s106), and decodes the Huffman data (step s108). Afterwards, it re-arranges the frequency spectrum line (step s110), and incorporates the stereo process (if it is used) (step s112). Finally, it eliminates the return distortion (step s114). The pre-process portion 10 is mostly used for the process of the bit stream. In general, the operation quantity for this portion is not so large. However, the process is very fussy, and thus this portion generally can be implemented by using the finite state machine and the embedded micro-controller, so that the entire system design can be effectively simplified. There has been a lot of research aimed at this portion in recent years.

The post-process portion 12 mostly comprises the synthesis process of the inverse-modified discrete cosine transform (abbreviated as IMDCT) and the overlap-add of the present invention (these two processes cooperate and are called the dynamic window inverse-modified discrete cosine transform (abbreviated as DWIMDCT)) (step s116) and also the process of the synthesis filterbank (step s118). After the process of the synthesis filter bank, the pulse code modulation sample is output (step s120). In general, the quantity of the operation of the post-process 12 is larger than the pre-process 10, and takes about 80% of the whole process. Because of this, the post-process 12 needs to be implemented by an appropriate hardware structure, so that the entire system can fulfill the low cost and high performance requirements.

Figure 2:
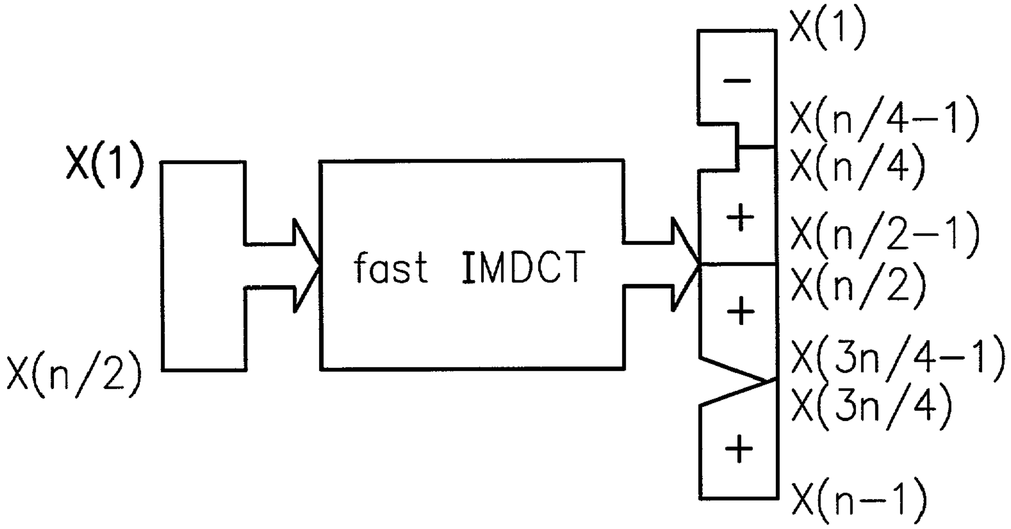
FIG. 2 schematically shows the flow chart of the inverse-modified discrete cosine transform and overlap-add method for MPEG Layer3 audio signal decoding of a preferred embodiment according to the present invention.

In order to have the entire system fulfill the low cost and high performance requirements, the present invention provides a flow chart of a preferred embodiment using the inverse-modified discrete cosine transform and overlap-add method for MPEG Layer3 audio signal decoding (that is the IMDCT fast algorithm), as shown in FIG. 2. The 32 subband samples of the compressed audio signal are applied with the operation of the inverse-modified discrete cosine transform and overlap-add by the IMDCT fast algorithm according to equation (1), inverse-modified discrete cosine transform:

$$x(i)=\sum_{k=0}^{\frac{n}{2}-1} X(k)*\cos(i,k)\quad 0\le i\le\frac{n}{4}-1 \text{ and } \frac{n}{2}\le i\le\frac{3n}{4}-1$$

overlap-add:

$$Z(i)=x(i)*\mathrm{win}(i,p)$$

$$Z\left(\frac{n}{2}-1-i\right)=-x(i)*\mathrm{win}\left(\frac{n}{2}-1-i,\,p\right)\quad 0\le i\le\frac{n}{4}-1$$

$$Z(n-1-i)=x(i)*\mathrm{win}(n-1-i,\,p)\quad \frac{n}{2}\le i\le\frac{3n}{4}-1,$$

where X(k) is the sub-band sample, Z(i) is the sub-band sample after process, when window type is 0, 1, 3, n equals 36; whereas when window type is 2, n equals 12. The equation (1) above indicates that the quantity of the operation can be reduced from n to n/2. That is, the quantity of the operation of the inverse-modified discrete cosine transform in the DWIMDCT can be reduced by half. Table 1 lists the comparison of the quantity of the operation of the original and the present invention. As shown in Table 1, when the window type is 0, 1, 3, the ratio of the present invention to the original is 0.48 MOPS (million operation per second). When the window type is 2, the ratio of the present invention to the original is 0.42 MOPS. Therefore, the quantity of the operation of the inverse-modified discrete cosine transform can be significantly reduced.

TABLE 1

| Function | Window Type | Original | Present Invention | Ratio (MOPS) |
|---|---|---|---|---|
| IMDCT | Type 0, 1, 3 | 2.1 | 1 | 0.48 |
| | Type 2 | 1 | 0.42 | 0.42 |

Figure 3:
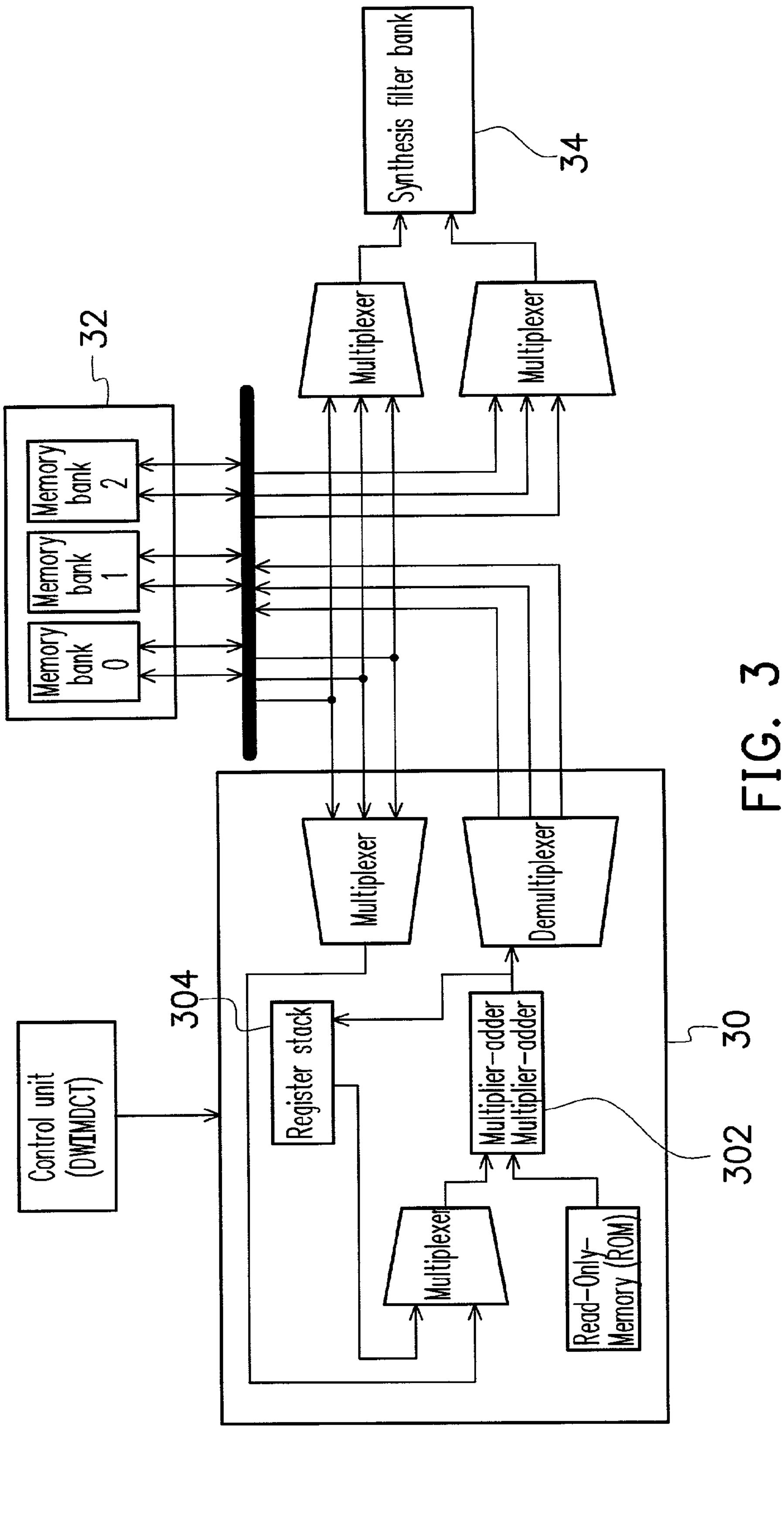
FIG. 3 schematically shows the hardware structure diagram of the inverse-modified discrete cosine transform and overlap-add hardware structure for MPEG Layer3 audio signal decoding of a preferred embodiment according to the present invention.

Afterwards, the entire hardware structure is implemented by using the fast algorithm. FIG. 3 schematically shows the hardware structure diagram of the inverse-modified discrete cosine transform and overlap-add hardware structure for MPEG Layer3 audio signal decoding of a preferred embodiment according to the present invention. The hardware structure comprises the DWIMDCT module 30 and the DWIMDCT buffer memory 32. Wherein, the DWIMDCT module 30 mostly comprises the multiplier-adder (MACO) 302 and the register stack 304. The operation method of the hardware structure is described hereafter.

Figure 4:
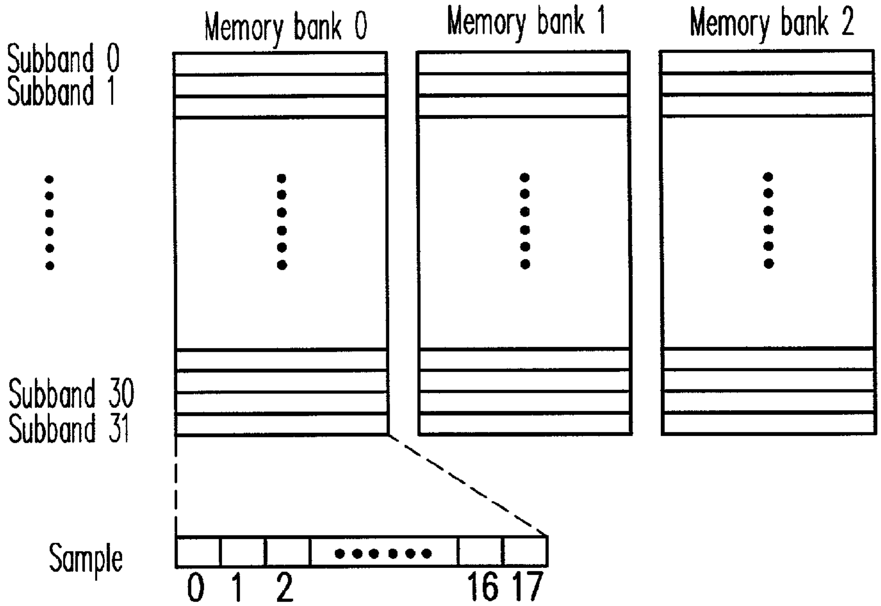
FIG. 4 schematically shows the layout diagram of the DWIMDCT buffer memory of FIG. 3.
Figure 5:
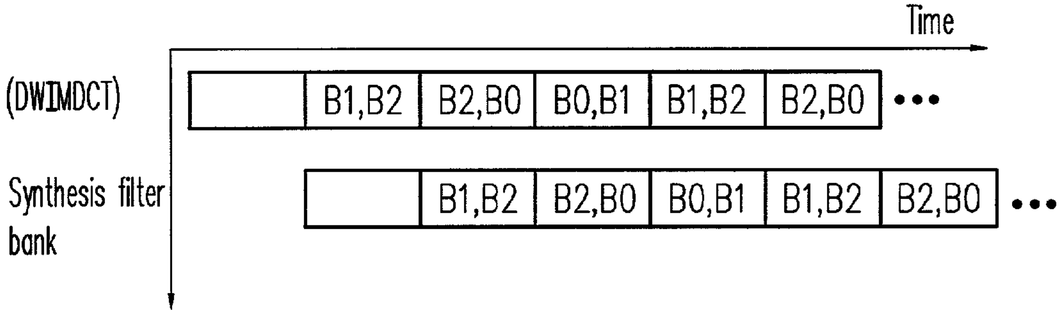
FIG. 5 schematically shows the sketch map of the sequence of writing of the memory bank in the DWIMDCT buffer memory and the sequence of reading of the synthesis filter bank.

At first, the multiplier-adder 302 is utilized by the inverse-modified discrete cosine transform for calculation, and the final result is subsequently stored in the register stack 304. The register stack 304 comprises 18 registers. After the operation of the inverse-modified discrete cosine transform, the overlap-add of the dynamic window is the follow-on operation. The operation of the overlap-add of the dynamic window is also accomplished by using the multiplier-adder 302, and the final result is stored in the DWIMDCT buffer memory 32. FIG. 4 schematically shows the layout diagram of the DWIMDCT buffer memory 32. As is shown in the diagram, the DWIMDCT buffer memory 32 comprises 3 memory banks (memory bank 0, memory bank 1 and memory bank 2), each memory bank can be further divided into 32 sub-band blocks, and each sub-band block is able to store 18 sample data. Furthermore, the hardware structure and the synthesis filter bank of the present invention are able to form a two-stage high performance pipeline process. The sequence of the DWIMDCT writing of the sample data contained in each memory bank of the DWIMDCT buffer memory 32 and the sequence of the reading of the synthesis filter bank are shown in FIG. 5.

The hardware structure of the inverse-modified discrete cosine transform and overlap-add for MPEG Layer3 audio signal decoding according to the present invention is easily compatible with the hardware of other modules, and is suitable for the design of the very large scale integration (VLSI). If the synthesis filter bank module can be integrated, the hardware utilization will be significantly enhanced, as will the operation performance of the entire decoder. Therefore, the MPEG Layer3 can be implemented by the ASIC, so that the entire system can fulfill the low cost and high performance requirements.

In summary, the present invention bears the following advantages:

1. The present invention provides a low cost fast algorithm of the inverse-modified discrete cosine transform and overlap-add.
2. The present invention provides a hardware structure that is suitable for the inverse-modified discrete cosine transform and overlap-add in the MPEG Layer3 decoder.
3. The hardware structure of the present invention makes the MPEG Layer3 able to be implemented by the ASIC, so that the entire system fulfills the low cost and high performance requirements.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for an inverse-modified discrete cosine transform and overlap-add for MPEG Layer3 audio signal decoding, comprising the steps of:

applying an operation of the inverse-modified discrete cosine transform and overlap-add according to equation (1) to 32 sub-band samples of a compressed audio signal, wherein the equation (1) includes an inverse-modified discrete cosine transform:

$$x(i)=\sum_{k=0}^{\frac{n}{2}-1}X(k)*\cos(i,k)\quad 0\le i\le\frac{n}{4}-1\ \text{and}\ \frac{n}{2}\le i\le\frac{3n}{4}-1$$

Wherein $$\cos(i,k)=\cos\left(\frac{\pi}{2n}\left(2i+1+\frac{n}{2}\right)(2k+1)\right),$$

for I and k=0 to n−1 and an overlap-add:

$$Z(i)=x(i)*\mathrm{win}(i,p)$$

$$Z\left(\frac{n}{2}-1-i\right)=-x(i)*\mathrm{win}\left(\frac{n}{2}-1-i,\,p\right)\quad 0\le i\le\frac{n}{4}-1$$

$$Z(i)=x(i)*\mathrm{win}(i,p)$$

$$Z(n-1-i)=x(i)*\mathrm{win}(n-1-i,\,p)\quad \frac{n}{2}\le i\le\frac{3n}{4}-1,$$

where X(k) is the sub-band sample, Z(i) is the sub-band sample after process, when a window type is 0, 1, 3, n equals 36, and when the window type is 2, n equals 12;

providing a dynamic window inverse-modified discrete cosine transform (DWIMDGT) module, wherein a multiplier-adder of the dynamic window inverse-modified discrete cosine transform module processes an operation of the inverse-modified discrete cosine transform, and an operation result of the inverse-modified discrete cosine transform is stored in a register stack of the dynamic window inverse-modified discrete cosine transform module; and using the multiplier-adder to operate the overlap-add operation, and an operation result of the overlap-add is stored in a dynamic window inverse-modified discrete cosine transform buffer memory.

2. The method of claim 1, further comprising the steps of:

applying a modularized memory layout and a data arrangement method to the dynamic window inverse-modified discrete cosine transform buffer memory to store a plurality of data generated by the dynamic window inversemodified discrete cosine transform module to provide a reading operation of a synthesis filter bank module; and alternately writing to and reading from the dynamic window inverse-modified discrete cosine transform buffer memory.

3. The method of claim 2, wherein the dynamic window inverse-modified discrete cosine transform module and the synthesis filter bank module can be implemented in a manner of a pipeline process.

4. The method of claim 2, wherein the dynamic window inverse-modified discrete cosine transform buffer memory comprises 3 memory banks, each of the memory banks is further divided into 32 sub-band blocks, and each of the sub-band blocks is able to store 18 sample data.

5. The method of claim 4, wherein the writing of the dynamic window inverse-modified discrete cosine transform of the sample data contained in each of the memory banks of the dynamic window inverse-modified discrete cosine transform buffer memory and the reading of the synthesis filter bank follows a specific sequence.

6. The method of claim 1, wherein the register stack comprises 18 registers.

7. The method of claim 1, wherein the method can be used in a hardware structure design of a post-process portion in an audio decoding process of a Layer3 compression method in an MPEG compression standard (MP3).

8. A hardware structure of an inverse-modified discrete cosine transform and an overlap-add for MPEG Layer3 audio signal decoding, comprising:

a dynamic window inverse-modified discrete cosine transform module, comprising:

a multiplier-adder, used to calculate the inverse-modified discrete cosine transform and the overlap-add; and a register stack, coupled to the multiplier-adder, used to store an operation result of the inverse-modified discrete cosine transform; and a dynamic window inverse-modified discrete cosine transform buffer memory, coupled to the dynamic window inverse-modified discrete cosine transform module, used to store an operation result of the overlap-add.

9. The hardware structure of claim 8, wherein the inverse-modified discrete cosine transform and the overlap-add are operated by equation (1) below:

the inverse-modified discrete cosine transform:

$$x(i)=\sum_{k=0}^{\frac{n}{2}-1} X(k)*\cos(i,k)\quad 0\le i\le \frac{n}{4}-1 \text{ and } \frac{n}{2}\le i\le \frac{3n}{4}-1$$

Wherein $$\cos(i,k)=\cos\left(\frac{\pi}{2n}\left(2i+1+\frac{n}{2}\right)(2k+1)\right),$$

for I and k=0 to n−1 the overlap-add:

$$Z(i)=x(i)*\text{win}(i,p)$$

$$Z\left(\frac{n}{2}-1-i\right)=-x(i)*\text{win}\left(\frac{n}{2}-1-i,p\right)\quad 0\le i\le \frac{n}{4}-1$$

$$Z(i)=x(i)*\text{win}(i,p)$$

$$Z(n-1-i)=x(i)*win(n-1-i,p)\ \frac{n}{2}\le i\le \frac{3n}{4}-1,$$

where X(k) is a sub-band sample, Z(i) is the sub-band sample after process, when a window type is 0, 1, 3, n equals 36, and when the window type is 2, n equals −12.

10. The hardware structure of claim 8, wherein the dynamic window inverse-modified discrete cosine transform buffer memory is applied with an efficient memory layout and a data arrangement method, to store a plurality of data generated by the dynamic window inverse-modified discrete cosine transform module for providing a reading of a synthesis filter bank module.

11. The hardware structure of claim 10, wherein the dynamic window inverse-modified discrete cosine transform module and the synthesis filter bank module can be implemented in a pipeline process manner.

12. The hardware structure of claim 10, wherein the dynamic window inverse-modified discrete cosine transform buffer memory comprises 3 memory banks, each of the memory banks is further divided into 32 sub-band blocks, and each of the sub-band blocks is able to store 18 sample data.

13. The hardware structure of claim 12, wherein the writing of the inverse-modified discrete cosine transform of the sample data contained in each of the memory banks of the dynamic window inverse-modified discrete cosine transform buffer memory and the reading of the synthesis filter bank follow a specific sequence.

14. The hardware structure of claim 8, wherein the register stack comprises 18 registers.

15. The hardware structure of claim 8, wherein a hardware structure can be used in a hardware structure design of the post-process portion in the audio decoding process of the Layer3 compression method of the MPEG compression standard (MP3).

16. The hardware structure of claim 8, wherein the hardware structure can be implemented by applying the application specific integrated circuit (ASIC).

* * * * *